(12) United States Patent
Yang et al.

(10) Patent No.: US 11,434,393 B2
(45) Date of Patent: Sep. 6, 2022

(54) ADHESIVE FILM AND ADHESIVE SUBSTRATE

(71) Applicant: 3M INNOVATIVE PROPERTIES COMPANY, St. Paul, MN (US)

(72) Inventors: Yongsuk Yang, Gyeonggi-do (KR); Kyosung Hwang, Seoul (KR); Gyu Jin Jung, Gyeonggi-do (KR)

(73) Assignee: 3M INNOVATIVE PROPERTIES COMPANY, Saint Paul, MN (US)

(*) Notice: Subject to any disclaimer, the term of this patent is extended or adjusted under 35 U.S.C. 154(b) by 336 days.

(21) Appl. No.: 16/468,355

(22) PCT Filed: Dec. 14, 2017

(86) PCT No.: PCT/IB2017/057947
§ 371 (c)(1),
(2) Date: Jun. 11, 2019

(87) PCT Pub. No.: WO2018/109711
PCT Pub. Date: Jun. 21, 2018

(65) Prior Publication Data
US 2020/0010735 A1    Jan. 9, 2020

(30) Foreign Application Priority Data
Dec. 15, 2016 (KR) .................. 10-2016-0171410

(51) Int. Cl.
*C09J 7/10* (2018.01)
*C09J 7/40* (2018.01)
(Continued)

(52) U.S. Cl.
CPC ............. *C09J 7/10* (2018.01); *C08K 3/04* (2013.01); *C08K 3/22* (2013.01); *C08K 3/36* (2013.01);
(Continued)

(58) Field of Classification Search
None
See application file for complete search history.

(56) References Cited

U.S. PATENT DOCUMENTS

| 6,143,117 A | 11/2000 | Kelly |
| 7,534,498 B2 * | 5/2009 | Noda ............... B32B 43/006 428/446 |

(Continued)

FOREIGN PATENT DOCUMENTS

| JP | H02-049087 A | 2/1990 |
| JP | 2004-210866 A | 7/2004 |

(Continued)

OTHER PUBLICATIONS

International Search Report for PCT International Application No. PCT/IB2017/057947, dated Apr. 24, 2018, 2 pages.

*Primary Examiner* — Frank D Ducheneaux
(74) *Attorney, Agent, or Firm* — Daniel J. Iden

(57) ABSTRACT

The present invention relates to an adhesive film including a photothermal conversion layer including a light absorber and a thermally decomposable resin; and an adhesive layer, in which the thermally decomposable resin has a —COOH or —OH functional group and includes two kinds of acrylic resins having different weight average molecular weights, and an adhesive substrate including the adhesive film and a substrate to be processed. In the adhesive film and the adhesive substrate according to the present invention, it is possible to simplify a processing process of the substrate and reduce costs and time, and prevent damage to a substrate and a circuit or an element formed on the substrate.

14 Claims, 4 Drawing Sheets

(51) Int. Cl.
  *C09J 133/12* (2006.01)
  *C09J 133/06* (2006.01)
  *C09J 133/08* (2006.01)
  *C08K 3/04* (2006.01)
  *C08K 3/22* (2006.01)
  *C08K 3/36* (2006.01)
  *C09J 133/10* (2006.01)

(52) U.S. Cl.
  CPC ........... *C09J 7/403* (2018.01); *C09J 133/066* (2013.01); *C09J 133/08* (2013.01); *C09J 133/10* (2013.01); *C09J 133/12* (2013.01); *C08K 2003/2227* (2013.01); *C08K 2003/2241* (2013.01); *C09J 2301/312* (2020.08); *C09J 2301/40* (2020.08); *C09J 2301/41* (2020.08); *C09J 2301/416* (2020.08); *C09J 2301/502* (2020.08); *C09J 2433/00* (2013.01)

(56) References Cited

U.S. PATENT DOCUMENTS

| | | | | |
|---|---|---|---|---|
| 7,988,807 | B2* | 8/2011 | Noda | H01L 21/67132 156/272.2 |
| 8,038,839 | B2* | 10/2011 | Noda | H01L 21/6836 156/712 |
| 8,789,569 | B2* | 7/2014 | Noda | H01L 21/6835 156/382 |
| 8,800,631 | B2* | 8/2014 | Noda | B32B 43/006 156/753 |
| 9,355,877 | B2 | 5/2016 | Lee | |
| 10,596,792 | B2 | 3/2020 | Yamamoto et al. | |
| 2005/0118362 | A1 | 6/2005 | Kim | |
| 2007/0077685 | A1 | 4/2007 | Noda | |
| 2009/0017248 | A1 | 1/2009 | Larson | |
| 2009/0017323 | A1 | 1/2009 | Webb | |
| 2009/0258225 | A1* | 10/2009 | Nishida | B32B 27/36 428/352 |
| 2009/0262294 | A9 | 10/2009 | Templier | |
| 2011/0073847 | A1 | 3/2011 | Kobayashi | |
| 2013/0084459 | A1 | 4/2013 | Larson et al. | |
| 2013/0284039 | A1 | 10/2013 | Sugasaki | |
| 2015/0030884 | A1 | 1/2015 | Park | |
| 2015/0232621 | A1 | 8/2015 | Jeong | |
| 2016/0104690 | A1 | 4/2016 | Hu | |
| 2017/0368808 | A1 | 12/2017 | Fujita et al. | |

FOREIGN PATENT DOCUMENTS

| | | |
|---|---|---|
| JP | 2004-339285 A | 12/2004 |
| KR | 10-1532756 | 7/2015 |
| WO | WO 2012-173066 A1 | 12/2012 |
| WO | WO 2014-137801 A1 | 9/2014 |
| WO | WO 2012-153795 A1 | 11/2015 |

* cited by examiner

ADHESIVE FILM AND ADHESIVE SUBSTRATE

CROSS REFERENCE TO RELATED APPLICATIONS

This application is a national stage filing under 35 U.S.C. 371 of PCT/IB2017/057947, filed Dec. 14, 2017, which claims the benefit of KR Application No.: 10-2016-017410, filed Dec. 15, 2016, the disclosure of which is incorporated by reference in its/their entirety herein.

The present invention relates to an adhesive film and an adhesive substrate, and more specifically, to an adhesive substrate including a substrate to be processed used in a processing process of a substrate and an adhesive film disposed between the substrate to be processed and a supporter.

BACKGROUND

In various fields, it is often preferable to use a thin substrate or a flexible substrate. In the process of forming the thin substrate or using the flexible substrate, there is provided a process of separating the substrate from the hade supporter after the substrate adheres to a hard supporter and then the processing of the substrate is completed.

As an example, in a field of quartz devices, it is preferable to reduce a thickness of a quartz wafer to increase an oscillation frequency. Particularly, in the semiconductor industry, in order to manufacture the semiconductor with high density by a chip laminating technology and reduce the thickness of a semiconductor package, efforts are being made to further reduce the thickness of a semiconductor wafer.

The reduction in thickness is performed by so-called rear-side grinding of the semiconductor wafer on an opposite surface to a surface including a pattern-formed circuit. For the reduction in thickness, there is provided a method in which while the wafer is firmly fixed on the hard supporter by an adhesive, the rear side of the wafer is grinded and conveyed, and then the wafer is separated from the hard supporter. The wafer is supported by using the hard supporter, thereby preventing the breakage of the wafer while the rear side is grinded and conveyed and processing the wafer at a small thickness level.

Meanwhile, as another example, a flexible display capable of enhancing an aesthetic function and giving various functions in use has been developed, and in this case, it is preferable to use the flexible substrate. The flexible display is expected as a next-generation display that replaces a portable computer, an electronic newspaper or a smart card, and a printing medium such as a book, a newspaper, a magazine and the like. Such a display is required to have a variety of materials according to enhancement of an aesthetic function, thinness and light weight, and various flexible substrates are applied and used. For example, a thin film metal sheet, plastic, and the like may be used on the flexible substrate.

However, it is difficult that the flexible substrate is applied to manufacturing equipment for existing displays designed by targeting a glass or quartz substrate due to a bending characteristic. For example, there is a limitation in that it is difficult to convey the flexible substrate by track equipment or robots or receive the flexible substrate in a cassette.

Accordingly, the flexible substrate adheres onto the hard supporter before elements are formed, the supporter supports the flexible substrate while the elements are formed on the flexible substrate, and the supporter is peeled from the flexible substrate after the elements are formed on the substrate. As a result, even though the flexible substrate is used, a flexible display in which the elements are stably formed may be provided.

However, such a process further includes coating an adhesive between the substrate and the hard supporter, curing the adhesive, and the like, and as a result, there is a problem in that the process is complicated and costs and time are added. Furthermore, in the process of separating the substrate from the hard substrate after the processing of the substrate, there is a problem in that the wafer or the substrate itself is damaged, or the circuit of the wafer and the element of the flexible substrate are damaged.

DISCLOSURE

An object of the present invention is to provide an adhesive film and an adhesive substrate so that a substrate fixed on a supporter may be easily peeled from a supporter. As a result, when the substrate is separated from the supporter, it is possible to prevent damage and breakage to a substrate and an element or a circuit formed on the substrate by physical force.

In addition, another object of the present invention is to provide in particular, an adhesive film and an adhesive substrate which has excellent heat resistance and an excellent light blocking effect to prevent the damage to the substrate to be processed and an element or a circuit formed on the substrate.

Yet another object of the present invention is to provide an adhesive film and an adhesive substrate capable of reducing costs and time by fixing the substrate to be processed on the supporter and simplifying a peeling process.

Still another object of the present invention is to provide an adhesive substrate capable of simplifying a process and reducing time and costs by omitting a process of attaching the adhesive film to the substrate to be processed in the processing process of the substrate, by providing the adhesive substrate including the substrate to be processed.

TECHNICAL SOLUTION

An adhesive film of the present invention for solving the problems in the related art includes a photothermal conversion layer including a light absorber and a thermally decomposable resin; and an adhesive layer, in which the thermally decomposable resin has a —COOH or —OH functional group and includes two kinds of acrylic resins having different weight average molecular weights. As a result, the photothermal conversion layer may have a film shape having a sufficient thickness, and the adhesive film may be easily bonded to the supporter when the photothermal conversion layer is used for a processing process of the substrate later. Further, after the processing of the substrate is completed, the substrate is easily separated by laser irradiation to prevent damage to the substrate and the circuit or element formed on the substrate.

The light absorber may be carbon black. The carbon black absorbs radiation energy to be applied to convert the radiation energy into thermal energy and the generated thermal energy causes the decomposition of the thermally decomposable resin, and thus the photothermal conversion layer may be divided into two parts.

The two kinds of acrylic resins may be a high molecular weight acrylic resin and a low molecular weight acrylic resin, and the high molecular weight acrylic resin may have a larger molecular weight than the low molecular weight acrylic resin, the weight average molecular weight of the high molecular weight acrylic resin may be 400,000 g/mol to 15,000,000 g/mol, and the weight average molecular weight of the low molecular weight acrylic resin may be 50,000 g/mol to 600,000 g/mol. The high molecular weight acrylic resin allows the photothermal conversion layer to have excellent heat resistance and the low molecular weight acrylic resin serves to improve the adhesion of the photothermal conversion layer and is advantageous for filming.

A weight ratio of the high molecular weight acrylic resin to the low molecular weight acrylic resin may be 1:4 to 4:1. The high molecular weight acrylic resin to the low molecular weight acrylic resin are used at an appropriate ratio to form a photothermal conversion layer having excellent lamination performance and film formability while having excellent heat resistance.

The two kinds of acrylic resins may include monomers selected from the group consisting of methyl methacrylate (MMA), hydroxylethyl methacrylate (HEMA), ethyl acrylate (EA), butyl acrylate (BA), acrylonitrile (AN), and combinations thereof.

An acid value of the —COOH or —OH functional group may be 1 mgKOH/g or more. As a result, the adhesive film may be easily bonded to the supporter when being used for a processing process of the substrate later.

The photothermal conversion layer may further include an inorganic filler. The inorganic filler may prevent re-adhesion after the photothermal conversion layer is divided.

The inorganic filler may be selected from the group consisting of $SiO_2$, $Al_2O_3$, $TiO_2$ and combinations thereof.

The photothermal conversion layer may further include a dispersant. The dispersant may improve the dispersion of the light absorber and the inorganic filler.

The photothermal conversion layer may have a thickness of 1 μm to 15 μm. As a result, it is possible to minimize the residue of the photothermal conversion layer, prevent the damage to the substrate by the laser, and facilitate the separation of the substrate and the supporter.

The adhesive film may further include a first liner and a second liner, in which the first liner, the adhesive layer, the photothermal conversion layer, and the second liner may be sequentially laminated. That is, the adhesive film according to the present invention is a film form, and the using process of the adhesive film may be more simplified by removing and using the first liner and the second liner in use later.

Meanwhile, a method for processing a substrate using the adhesive film of the present invention includes providing the adhesive film according to the present invention; attaching the photothermal conversion layer of the adhesive film to a supporter and attaching the adhesive layer to a substrate to be processed; forming a processed substrate by processing the substrate to be processed; dividing the photothermal conversion layer by irradiating a laser to the photothermal conversion layer from the supporter side and separating the supporter from the processed substrate; and removing the adhesive layer from the processed substrate by using a removal tape or a removal solution.

The processing of the substrate to be processed may include grinding an opposite surface of the substrate to be processed in which the adhesive is not adhered.

The substrate to be processed may be a flexible substrate, and the processing of the substrate to be processed may include forming an element layer on the substrate to be processed.

Meanwhile, an adhesive substrate of the present invention includes the adhesive film described above; and a substrate to be processed which is disposed on the adhesive layer of the adhesive film. That is, the adhesive substrate of the present invention may have a structure in which the photothermal conversion layer, the adhesive layer, and the substrate to be processed are sequentially laminated. As a result, in the processing process of the substrate, the attaching of the adhesive film to the substrate to be processed can be omitted, to simplif the process and reduce the time and costs.

The adhesive substrate may further include a liner which is disposed on the photothermal conversion layer of the adhesive film. The adhesive substrate according to the present invention includes a substrate to be processed and may be used by removing only one liner at the time of use in the substrate processing process later and attaching the adhesive substrate to the supporter, thereby more simplifying the substrate processing process.

Meanwhile, a method for processing a substrate using the adhesive substrate of the present invention includes providing the adhesive substrate according to the present invention; attaching the photothermal conversion layer of the adhesive substrate to a supporter; forming a processed substrate by processing the substrate to be processed; dividing the photothermal conversion layer by irradiating a laser to the photothermal conversion layer from the supporter side and separating the supporter from the processed substrate; and removing the adhesive layer from the processed substrate by using a removal tape or a removal solution.

ADVANTAGEOUS EFFECTS

The adhesive film according to the present invention can easily separate a substrate fixed on a supporter from the supporter and has excellent heat resistance and an excellent light blocking effect. As a result, when the substrate is separated from the supporter, it is possible to prevent damage and breakage to a substrate and an element or a circuit formed on the substrate. Further, according to the present invention, the process of fixing the substrate to be processed onto the supporter can be simplified, thereby reducing costs and time.

BEST MODE

Figure 1:
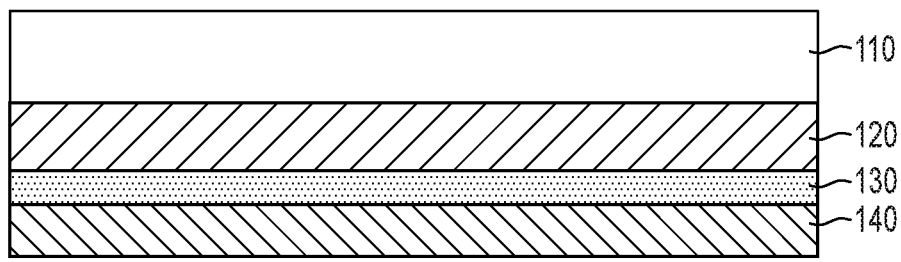
FIG. 1 is a cross-sectional view of an adhesive film according to the present invention.

Various advantages and features of the present invention and methods accomplishing thereof will become apparent from the following description of exemplary embodiments with reference to the accompanying drawings. However, the present invention is not limited to the following exemplary embodiments but may be implemented in various different forms. The exemplary embodiments are provided only to complete invention of the present invention and to fully provide a person having ordinary skill in the art to which the present invention pertains with the category of the invention, and the present invention will be defined by the appended claims.

The shapes, sizes, ratios, angles, numbers, and the like illustrated in the accompanying drawings for describing the exemplary embodiments of the present invention are merely examples, and the present invention is not limited thereto. Like reference numerals designate like elements throughout the present specification. Further, in the following description, the detailed description of known related technologies will be omitted when it is determined that the gist of the present invention may be unnecessarily obscured.

In the present specification, when 'include', 'have', and the like are used, other details other than the above-mentioned details may be added unless the expression "only" is used. Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

The features of the exemplary embodiments of the present invention can be partially or entirely connected or combined with each other, and technically various interlocking and driving are possible.

Hereinafter, exemplary embodiments of the present invention will be described with reference to the accompanying drawings. The following exemplary embodiments will be provided as examples so that the spirit of the present invention will be fully conveyed to those skilled in the art. Therefore, the present invention is not limited to exemplary embodiments to be described below and may be implemented in various different ways.

FIG. 1 is a cross-sectional view of an adhesive film according to an exemplary embodiment of the present invention. Referring to FIG. 1, an adhesive film according to an exemplary embodiment of the present invention includes a first liner 110, an adhesive layer 120, a photothermal conversion layer 130, and a second liner 140, which are sequentially laminated.

The adhesive film of the present invention has a film shape and may be configured by laminating the adhesive layer 120 formed in a film shape and the photothermal conversion layer 130 formed in the film shape. In the process of processing the substrate to be processed later, the adhesive layer 120 adheres to the substrate to be processed and the photothermal conversion layer 130 adheres to the hard supporter.

More particularly, the photothermal conversion layer 130 is divided by irradiating radiation energy such as a laser so that the substrate or an element or a circuit on the substrate may be separated from the supporter without damage.

The photothermal conversion layer 130 includes an light absorber and a thermally decomposable resin. The radiation energy applied to the photothermal conversion layer 130 in a form such as a laser and the like is absorbed by the light absorber and converted into thermal energy. The generated thermal energy rapidly increases the temperature of the photothermal conversion layer 130 and the temperature reaches a thermal decomposition temperature of the thermally decomposable resin (an organic ingredient) in the photothermal conversion layer 130 to cause the thermal decomposition of the resin. The gas generated by thermal decomposition forms a void layer (such as a space) in the photothermal conversion layer 130 and the photothermal conversion layer 130 is divided into two parts to separate the supporter and the substrate from each other.

The light absorber may absorb the radiation energy and convert the absorbed radiation energy into thermal energy. Further, the light absorber serves to block light to prevent the substrate to be processed from being damaged by the laser and the like.

Although the light absorber is changed depending on a wavelength of the laser, examples of usable light absorbers include carbon black, graphite powder, microparticle metal powder such as iron, aluminum, copper, nickel, cobalt, manganese, chromium, zinc and tellurium, metal oxide powder such as black titanium oxide, and dyes and pigments such as an aromatic diamino-based metal complex, an aliphatic diamine-based metal complex, an aromatic dithiol-base metal complex, a mercaptophenol-based metal complex, a squarylium-based compound, an acyanine-based dye, a methine-based dye, a naphthoquinone-based dye, and an anthraquinone-based dye. The light absorber may be a form of a film including a vapor deposited metal film.

In these light absorbers, the carbon black is particularly useful, and the reason is that the carbon black significantly reduces the force required for separating the substrate from the supporter after irradiation and accelerates the separation.

The particle size of the light absorber in the photothermal conversion layer 130 may be about 20 nm to about 2000 nm, preferably about 50 nm to about 1000 nm, and more preferably about 100 nm to about 350 nm. When the particle size of the light absorber is less than about 20 nm, it is difficult to disperse the light absorber, and as the particle size is smaller, a large amount may not be loaded due to a high surface area and there is a limitation in the loading amount. In addition, when the particle size of the light absorber exceeds about 2000 nm, the laser blocking performance is reduced, and the division performance of the photothermal conversion layer 130 by the laser is reduced. In addition, as the particle size of the light absorber is increased, the film formability is decreased, the dispersion stability after dispersion is decreased, and the time until preparing and coating a liquid need to be shortened.

The content of the light absorber in the photothermal conversion layer 130 is about 5 wt % to about 80 wt %, preferably about 10 wt % to about 60 wt %, and more preferably about 20 wt % to about 50 wt % based on the total weight of the photothermal conversion layer 130. When the content of the light absorber is less than about 5 wt %, the separation by the laser is difficult. Further, when the content of the light absorber is more than about 80 wt %, a part of the photothermal conversion layer 130 divided by the laser remains on the surface of the adhesive layer 120 after the division of the photothermal conversion layer 130 by the laser, and in this case, the adhesion is too low due to the high carbon content. In this case, in the process of removing the adhesive layer 120 by a removal tape later, there is a problem in that the adhesive layer 120 is difficult to be removed because the adhesive layer 120 does not adhere well to the removal tape. Further, as the content of the light absorber is increased, the adhesion on the surface of the photothermal conversion layer 130 is too low, and thus it is difficult to be laminated with the supporter and the dispersion of the light absorber is not uniform.

The thermally decomposable resin in the photothermal conversion layer 30 includes an acrylic resin. Preferably, the acrylic resin includes monomers selected from the group consisting of methyl methacrylate (MMA), hydroxylethyl methacrylate (HEMA), ethyl acrylate (EA), butyl acrylate (BA), acrylonitrile (AN), and combinations thereof. Preferably, the acrylic resin may be selected from the group consisting of three or more of combinations of methyl methacrylate (MMA), hydroxylethyl methacrylate (HEMA), ethyl acrylate (EA), butyl acrylate (BA), acrylonitrile (AN). The acrylic resin may have a suitable molecular weight, Tg, heat resistance and functional groups.

The content of the acrylic resin may be about 5 wt % to about 80 wt %, preferably about 15 wt % to about 60 wt %, and more preferably about 40 wt % to about 60 wt % based on the total weight of the photothermal conversion layer 130. When the content of the acrylic resin is less than about 5 wt %, the film formation is reduced, and it is difficult to adjust the thickness of the photothermal conversion layer 130, and the adhesion of the surface of the photothermal conversion layer 130 becomes too low and thus the lamination with the supporter is difficult. Further, when the content of the acrylic resin is more than about 80 wt %, physical force is required to divide the photothermal conversion layer 130 after the laser irradiation, and it is difficult to separate the substrate from the supporter, and damage to the substrate to be processed and the element or the circuit formed on the substrate may occur.

The acrylic resin includes preferably two kinds of acrylic resins having different weight average molecular weights, and more preferably a high molecular weight acrylic resin and a low molecular weight acrylic resin. The high molecular weight acrylic resin allows the photothermal conversion layer 130 to have excellent heat resistance and the low molecular weight acrylic resin serves to improve the adhesion of the photothermal conversion layer 130 and is advantageous for filming.

At this time, a glass transition temperature Tg of the high molecular weight acrylic resin may 0° C. to 10° C., and the Tg of the low molecular weight acrylic resin may be –10° C. to 0° C. When the Tg of the high molecular weight acrylic resin is higher than 10° C. and the Tg of the low molecular weight acrylic resin is higher than 0° C., the heat resistance of the photothermal conversion layer 130 may be improved, but the surface adhesion may be decreased. When the surface of the photothermal conversion layer 130 has low adhesion, releasing failure may occur when the adhesive layer 120 is peeled using the removal tape. On the other hand, when the Tg of the low molecular weight acrylic resin is lower than –10° C., the bonding performance may be improved, but the heat resistance may be reduced.

The weight average molecular weight of the high molecular weight acrylic resin is about 400,000 g/mol to about 15,000,000 g/mol, preferably about 500,000 g/mol to about 1,200,000 g/mol, and more preferably about 700,000 g/mol to about 1,000,000 g/mol. When the weight average molecular weight of the high molecular weight acrylic resin is less than about 400,000 g/mol, the heat resistance of the photothermal conversion layer 130 is deteriorated, and when the weight average molecular weight of the high molecular weight acrylic resin is more than about 15,000,000 g/mol, it is not easy to coat the photothermal conversion layer 130 and mix the liquid.

The weight average molecular weight of the low molecular weight acrylic resin may be about 50,000 g/mol to about 600,000 g/mol, preferably about 100,000 g/mol to about 500,000 g/mol, and more preferably about 400,000 g/mol to about 500,000 g/mol. When the weight average molecular weight of the low molecular weight acrylic resin is less than about 50,000 g/mol, the heat resistance of the photothermal conversion layer 30 is deteriorated, and when the weight average molecular weight of the low molecular weight acrylic resin is more than about 600,000 g/mol, the lamination performance of the photothermal conversion layer 130 is deteriorated.

A weight ratio of the low molecular weight acrylic resin to the high molecular weight acrylic resin may be about 1:4 to about 4:1, preferably about 1:3 to about 3:1, and more preferably about 1:2 to about 2:1. When the content of the low molecular weight acrylic resin is significantly smaller than the content of the high molecular weight acrylic resin, the lamination performance of the photothermal conversion layer 130 is deteriorated. Further, when the content of the high molecular weight acrylic resin is significantly smaller than the content of the low molecular weight acrylic resin, the heat resistance of the photothermal conversion layer 130 is deteriorated and the adhesion is strong on the divided surface of the photothermal conversion layer 130 after the laser irradiation, and thus physically large force is required for separation.

The thermally decomposable resin has a —COOH or —OH functional group. Preferably, the thermally decomposable resin includes an acrylic resin having the —COOH or —OH functional group. The photothermal conversion layer 130 including the thermally decomposable resin having the —COOH or —OH functional group is not a pressure-sensitive adhesive type. The photothermal conversion layer 130 has the —COOH or —OH functional group to be bonded to the supporter by hydrogen bonding and for example, may be hydrogen-bonded to a silanol group on the glass surface of the supporter made of glass. In this case, the hydrogen bond provides initial adhesion for bonding between the adhesive layer and the supporter and the adherence between the photothermal conversion layer 130 and the supporter is largely increased due to heat generated in a process after the bonding process.

The —COOH or —OH functional group may have an acid value of about 1 mgKOH/g or more and preferably about 5 mgKOH/g or more. The lamination performance of the photothermal conversion layer 130 is based on the COOH or —OH functional group, and when the acid value of the COOH or —OH functional group is smaller than about 1 mgKOH/g, the lamination performance is deteriorated. The upper limit of the acid value of the COOH or —OH functional group is not a problem. However, due to a chemical structure, the COOH or —OH functional group may have an acid value of preferably about 1 mgKOH/g to about 50 mgKOH/g, more preferably about 1 mgKOH/g to about 30 mgKOH/g, and most preferably about 10 mgKOH/g to about 20 mgKOH/g.

The photothermal conversion layer 30 may further include an inorganic filler. The inorganic filler functions to prevent re-adhesion of the photothermal conversion layer 130 after the photothermal conversion layer 130 is divided due to the formation of the void layer as a result of thermal decomposition of the thermally decomposable resin. Accordingly, after the processing of the substrate, the physical force required for separation of the substrate and the supporter may be further reduced when the photothermal conversion layer 130 is divided by irradiating the laser.

The inorganic filler may be selected from the group consisting of $SiO_2$, $Al_2O_3$, $TiO_2$ and combinations thereof. Particularly, in the case of $TiO_2$, there is an additional light blocking effect on the substrate to be processed.

The particle size of the inorganic filler in the photothermal conversion layer 130 may be about 20 nm to about 2000 nm, preferably about 50 nm to about 1000 nm, and more preferably about 100 nm to about 350 nm. When the particle size of the inorganic filler is less than about 20 nm, dispersion of the inorganic filler is not easy in the manufacturing of the film and there is a limitation on the amount of the inorganic filler to be loaded. Also, when the particle size of the inorganic filler is more than about 2000 nm, the film formability is reduced and the dispersion durability after dispersion is deteriorated.

The content of the inorganic filler in the photothermal conversion layer 130 may be about 4 wt % to about 60 wt %, preferably about 5 wt % to about 50 wt %, and more preferably about 5 wt % to about 30 wt % based on the total weight of the photothermal conversion layer 130. When the content of the inorganic filler is less than about 4 wt %, the photothermal conversion layer 130 may be rebonded again over time because the adhesion of the separated surface after the separation process by the laser irradiation is large. Further, when the content of the inorganic filler is more than about 60 wt %, the adhesion of the photothermal conversion layer 130 is too low, and thus it is difficult to laminate the photothermal conversion layer 130 on the supporter, the film formability decreases, and the dispersion is not uniform.

The photothermal conversion layer 130 may further include a dispersant. The content of the dispersant may be about 0.1 wt % to about 10 wt %, preferably about 0.1 wt % to about 7 wt %, and more preferably about 0.1 wt % to about 5 wt % based on the total weight of the photothermal conversion layer 130. When the content of the dispersant is less than about 0.1 wt %, the dispersibility of the light absorber and the inorganic filler in the photothermal conversion layer 130 may be deteriorated, and the dispersion durability after dispersion may also be deteriorated. In addition, when the content of the dispersant is more than about 10 wt %, the heat resistance of the photothermal conversion layer 130 is deteriorated, added additives are decomposed at a high temperature and the weight loss is increased.

The photothermal conversion layer 130 may be formed in a film shape as follows. The light absorber such as carbon black is added to a solvent such as methyl ethyl ketone (MEK) or ethyl acetate (EA), and at this time, the dispersant and the inorganic filler may be added together and then dispersed through sonication. Two kinds of acrylic resins having different weight average molecular weights are stirred for 30 minutes at room temperature by a stirrer, and then a solution in which the light absorber is dispersed is added to the stirred mixture, and the mixture is stirred again under the same condition. Thereafter, the solvent is added to adjust the viscosity and solid content to an advantageous state for coating, and the solvent is applied on release polyethylene terephthalate (PET) with an appropriate thickness by a coater having a comma roll head, a slot die, or a lip die, and then dried at a temperature of about 90° C. to about 130° C. for 2 minutes or more to form the film type photothermal conversion layer.

The thickness of the photothermal conversion layer 130 is about 1 µm to about 15 µm, preferably about 2 µm to about 10 µm, and more preferably about 3 µm to about 6 µm. When the thickness of the photothermal conversion layer 130 is less than about 1 µm, a part of the adhesive layer 120 may be left on the substrate to be processed during the separation of the photothermal conversion layer 130, and the laser blocking performance by the light absorber may be deteriorated. Further, when the thickness of the photothermal conversion layer 130 exceeds about 15 µm, physically large force is required to separate the photothermal conversion layer 130 after the laser irradiation.

Such a photothermal conversion layer 130 is formed in the film shape. When the photothermal conversion layer 130 is directly applied on the supporter in a liquid form, the viscosity is low, the thickness is less than about 1 µm, and the thickness may not be formed to be sufficiently large. As a result, it is difficult to sufficiently use the light absorber capable of blocking the laser, and it is difficult to prevent damage of the laser to the substrate to be processed. The photothermal conversion layer 130 according to the present invention is formed in the film shape, and as a result, the thickness thereof is easily adjusted, and it is more advantageous to protect the substrate to be processed and the circuit or element formed thereon. Further, such a photothermal conversion layer 130 may have adhesion to the supporter of 150 gf/25 mm to 1600 gf/25 mm.

The adhesive layer 120 is used to fix the substrate to be processed to the supporter through the photothermal conversion layer 130. The adhesive layer 120 may be formed to directly contact the photothermal conversion layer 130.

After separation of the substrate and the supporter by decomposition of the photothermal conversion layer 130, the substrate having the adhesive layer 120 thereon is obtained. Accordingly, the adhesive layer 120 needs to be easily separated from the substrate by peeling or the like, and the adhesive layer 120 has an adhesive strength which is sufficiently high enough to fix the substrate to the supporter, but sufficiently low enough to allow separation from the substrate. Such an adhesive layer 120 has the film shape and is not a photocurable adhesive.

The adhesive layer 120 may be an acrylic adhesive layer. Preferably, the adhesive layer 120 may include 2-ethylhexyl alcohol (2-EHA), acrylic acid (AA), glycidyl methacrylate (GMA), and an isocyanate-based curing agent. In this case, the isocyanate-based curing agent may include a curing agent selected from the group consisting of toluene diisocyanate (TDI), methylene diphenyl diisocyanate (MDI), hexamethylene diisocyanate (HDI), isophorone diisocyanate (IPDI), xylene diisocyanate (XDI), and combinations thereof.

The thickness of the adhesive layer 120 is about 5 µm to about 100 µm, preferably about 5 µm to about 70 µm, and more preferably about 10 µm to about 60 µm. When the thickness of the adhesive layer 120 is less than about 5 µm, delamination may occur when distortion of the device is severe due to low adhesion. In addition, when the adhesive layer 120 is removed after the processing of the substrate to be processed is completed, the adhesive layer may be torn and the residue may remain. Further, when the thickness of the adhesive layer 120 is more than about 100 µm, the solvent may remain because the drying efficiency is lowered when the adhesive layer 120 is formed, and the cohesion of the adhesive layer 120 may be lowered and thus the residue may remain.

The first liner 110 and the second liner 140 serve to support and protect the adhesive layer 120 and the photothermal conversion layer 130, respectively. The first liner 110 and the second liner 140 are removed when the adhesive film is used.

The first liner 110 and the second liner 140 may be silicon-coated polyethylene terephthalate (PET), but are not limited thereto, and any material capable of supporting and protecting the adhesive layer 120 and the photothermal conversion layer 130 is sufficient.

Figure 2:
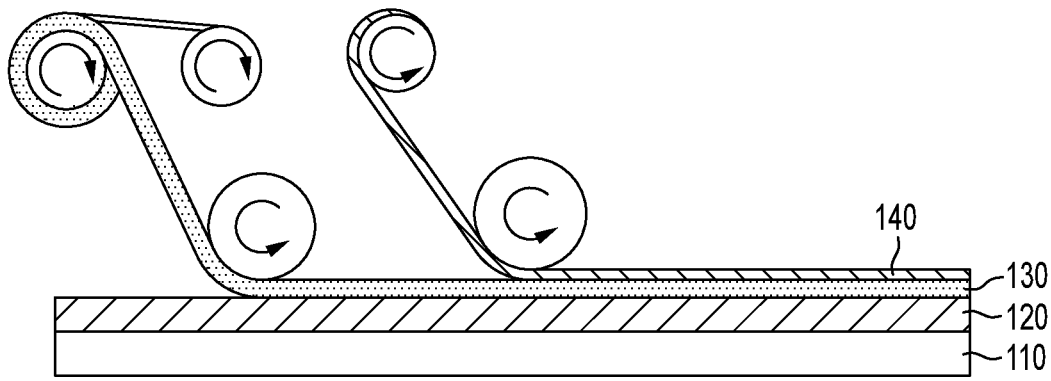
FIG. 2 is a diagram illustrating a manufacturing process of the adhesive film according to the present invention.

FIG. 2 is a diagram illustrating a manufacturing process of the adhesive film according to the exemplary embodiment of the present invention. Referring to FIG. 2, the film-shaped photothermal conversion layer 130 is laminated on the film-shaped adhesive layer 120 formed on the first liner 110 by a roll-to-roll method. Thereafter, similarly, the second liner 140 may be laminated on the photothermal conversion layer 130 by the roll-to-roll method.

However, the manufacturing process of the adhesive film of the present invention is not limited thereto, and any method in which the film-shaped adhesive layer 120 and the film-shaped photothermal conversion layer 130 are laminated in contact with each other is sufficient.

In the case of using a liquid adhesive material and a liquid photothermal conversion material between the substrate to be processed and the supporter, a process for forming the photothermal conversion layer by applying and curing the photothermal conversion material on the supporter and a process for forming the adhesive layer by applying and curing the adhesive material on the substrate to be processed are required, respectively. Thereafter, a process of bonding the adhesive layer and the photothermal conversion layer in a vacuum is required. That is, when a liquid material is used, a coating time, a curing time, and a bonding time are required.

On the other hand, in the case of using the film type adhesive film according to the present invention, a process of removing the first liner, attaching the adhesive layer to the substrate to be processed, removing the second liner, and attaching the photothermal conversion layer to the supporter is sufficient. Accordingly, the present invention may significantly reduce the required time of the process and reduce costs and the like required for the applying process, the curing process, the vacuum process, and the like.

Figure 3A:
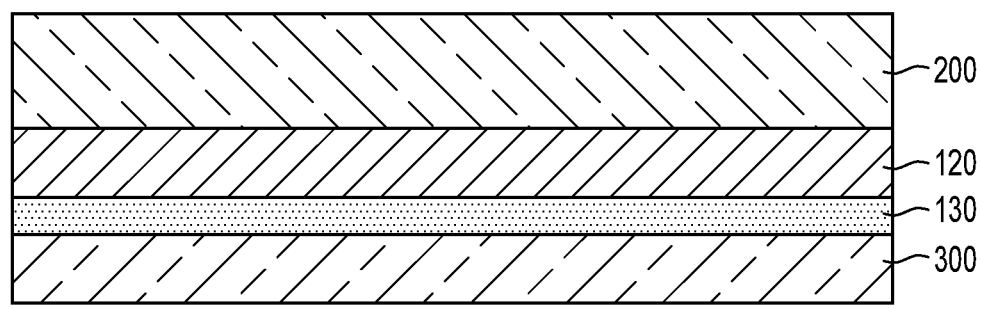
FIGS. 3A to 3C are diagrams illustrating a processing process of a substrate using the adhesive film according to the present invention.
Figure 3B:
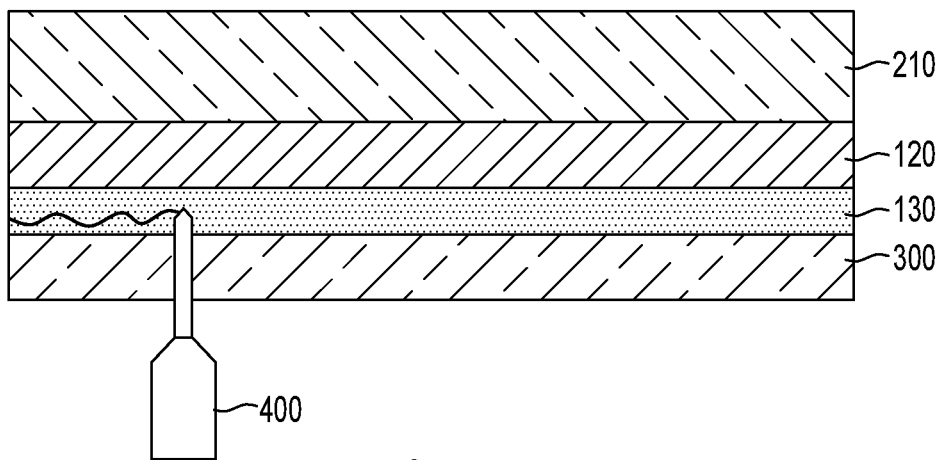
Figure 3C:
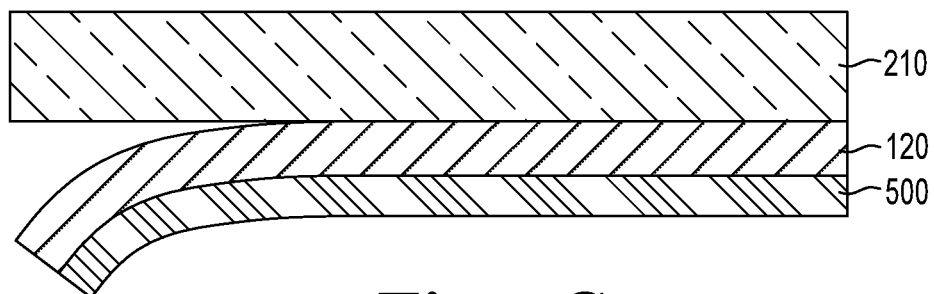

FIGS. 3A to 3C are diagrams illustrating a processing process of the substrate using the adhesive film according to the present invention.

Referring to FIG. 3A, in the adhesive film of the present invention, the second liner is removed, the photothermal conversion layer 130 is attached to the supporter 300, the first liner is removed, and the adhesive layer 120 is attached to the substrate 200 to be processed. In this case, the process is preferably performed at about 40° C. to about 80° C. so that the adhesion between the photothermal conversion layer 130 and the supporter 300 is increased.

The supporter 300 is a material capable of transmitting the radiation energy such as the laser used in the present invention and the material is required for maintaining the substrate 200 to be processed in a flat state and preventing the substrate 200 to be processed from being broken during processing and conveying. The supporter 300 is preferably hard and transmissive.

The transmissivity of the supporter 300 is not limited unless it prevents radiation energy from being transmitted into the photothermal conversion layer 130, in order to enable decomposition of the photothermal conversion layer 130. However, a transmittance may be, for example, about 50% or more.

In order to prevent the substrate to be processed from being distorted during processing, it is preferable that the supporter 300 has sufficiently high rigidity, and the bending strength of the supporter 300 is preferably $2 \times 10^{-3}$ (Pa·m$^3$) or greater and more preferably $3 \times 10^{-1}$ (Pa·m$^3$) or greater.

Further, it is preferable that the supporter 300 has sufficient heat resistance to prevent damage due to a thermal history that may occur in a process performed on the substrate to be processed, and the thermal deformation temperature of the supporter 300 is preferably 550° C. or higher and more preferably 700° C. or higher.

The supporter 300 may be, for example, glass. Further, in order to improve the adhesion strength to an adjacent layer such as the photothermal conversion layer 130, the supporter 300 may be surface-treated with a bonding agent or the like, if necessary.

Thereafter, the substrate 200 to be processed and the supporter 300 are fixed to each other with the adhesive film including the photothermal conversion layer 130 and the adhesive layer 120 interposed therebetween, and then the substrate 200 to be processed is processed.

The substrate 200 to be processed is a substrate which is fixed and processed to the supporter 300 and then separated from the supporter 300, and for example, may be a wafer or a substrate for a flexible display.

As an example, the substrate 200 to be processed may include a semiconductor wafer such as silicon and gallium arsenide, a quartz wafer, sapphire or glass. A circuit surface of the substrate 200 to be processed may adhere to the adhesive layer 120. Thereafter, the surface of the substrate 200 to be processed which does not adhere to the adhesive layer 120 may be ground by a grinder or the like to be processed into a thinned substrate.

As another example, the substrate 200 to be processed may be an epoxy mold wafer. A mold surface of the substrate 200 to be processed may adhere to the adhesive layer 120, and thereafter, the substrate 200 to be processed may be processed into a completed substrate by performing a predetermined process for connecting a circuit to the surface of the substrate 200 to be processed which does not adhere to the adhesive layer 120.

Meanwhile, as yet another example, the substrate 200 to be processed may be a plastic substrate, a metal thin film, or the like as the flexible substrate. For example, the substrate 200 to be processed may be PI. However, the substrate 200 to be processed is not limited thereto, and as a material having a flexible characteristic, a material that can be used as a substrate for a flexible display is sufficient.

For example, 'processing' may include a process of forming an element layer on the substrate 200 to be processed. Although not illustrated, the element layer may consist of a plurality of thin film layers and electrical elements, and more specifically, the element layer may include a thin film transistor including a gate electrode, a semiconductor layer, a source electrode, and a drain electrode.

The flexible display may be any one selected from the group consisting of an organic light emitting diode display, a liquid crystal display, and an electrophoretic display. However, the present invention is not limited thereto, and the flexible display may include all flexible displays using a flexible substrate.

Referring to FIG. 3B, after a desired level of processing, separation of a supporter 300 and a processed substrate 210 is performed by irradiating a laser 400. The laser 400 is irradiated from the supporter 300 side.

The light absorber of the photothermal conversion layer 130 absorbs the radiation energy by the laser 400 to convert the radiation energy into thermal energy. The generated thermal energy rapidly increases the temperature of the photothermal conversion layer 130 and the temperature causes decomposition of the thermally decomposable resin in the photothermal conversion layer 130. The gas generated by thermal decomposition forms a void layer in the photothermal conversion layer 130 and the photothermal conversion layer 130 is divided into two parts to separate the supporter 300 and the processed substrate 210 from each other.

The thermally decomposable resin in the photothermal conversion layer 130 is decomposed by the irradiation of the laser 400 to form a crack inside the layer so as to separate the photothermal conversion layer itself. The gas generated by the decomposition of the resin is eventually introduced between the two layers to separate the two layers from each other. Accordingly, in order to promote the introduction of the gas, it is preferable to perform irradiation of the laser 400 into the photothermal conversion layer 130 from the edge portion of the photothermal conversion layer 130.

In order to use the laser 400 from the edge portion of the photothermal conversion layer 130, a method of applying the laser 400 while reciprocating linearly from the edge portion, or alternatively, a method of spirally irradiating the laser 400 from the edge portion to the center like a phonograph may be used.

The laser 400 is generally a laser having a wavelength of about 300 to about 11,000 nm and preferably about 300 to about 2,000 nm, and as a specific example, the laser 400 includes a YAG laser emitting light at a wavelength of 1,064 nm, a second harmonic wave generation YAG laser at a wavelength of 532 nm, and a semiconductor laser having a wavelength of 780 to 1,300 nm.

Referring to FIG. 3C, after the supporter 300 is removed, the adhesive layer 120 on the processed substrate 210 is removed. In order to remove the adhesive layer 120, it is preferable to use a removal tape 500 having stronger adhesion to the adhesive layer 120 than the adhesion between the processed substrate 210 and the adhesive layer 120. Such a removal tape 500 can be disposed to adhere onto the adhesive layer 120 and thereafter, peeled together with the adhesive layer 120 to remove the adhesive layer 120 from the processed substrate 210. Although not illustrated in the drawing, after the photothermal conversion layer 130 is divided on the adhesive layer 120, a part of the photothermal conversion layer 130 may remain.

Meanwhile, although not illustrated in the drawing, after the supporter 300 is removed, a removal solution may be used for removal of the adhesive layer 120 on the processed substrate 210. Preferably, the adhesive layer 120, in which the part of the photothermal conversion layer remains, may be immersed in the removal solution to remove the adhesive layer 120. Preferably, the adhesive layer 120 may be immersed in the removal solution for about 10 seconds to 60 seconds. Further, the removal solution may include trans-1, 2-dichloroethylene and hydrofluoroether.

When the size or area of the processed substrate 210 is large, it may be difficult to remove the adhesive layer 120 at a time with the removal tape 500. However, when the removal solution is used, it is advantageous to remove the adhesive layer 120 having a large area. In addition, there is no need for additional external physical force, and the adhesive layer 120 may be removed without a residue in a short time.

The method of processing the substrate according to the present invention is eco-friendly because a solvent is not required when the substrate is processed by using an adhesive film prepared in advance. Further, in the case of using the adhesive film prepared in advance exposure to heat, UV and the like of the supporter and the substrate may be reduced at the time of the processing of the substrate, thereby preventing additional damage.

In addition, since the process of directly applying and curing the adhesive material or the photothermal conversion material on the supporter or the substrate to be processed may be omitted, the process may be simplified and the processing cost and time may be reduced. Furthermore, it is advantageous to form a uniform thickness of the adhesive layer and the photothermal conversion layer, and the process may also be used even in the processing of the large-area substrate.

Figure 4:
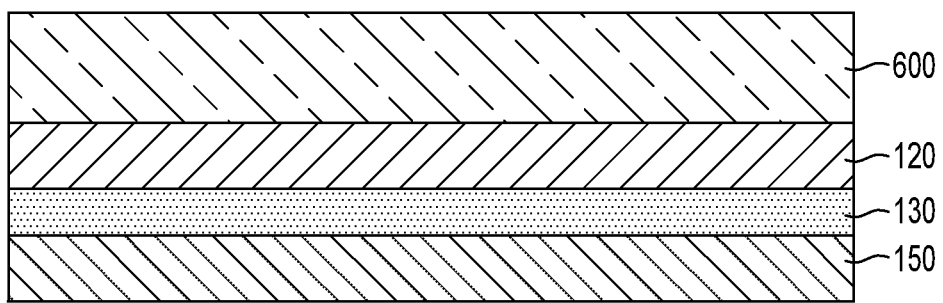
FIG. 4 is a cross-sectional view of an adhesive substrate according to the present invention.

Next, the adhesive substrate according to the present invention will be described with reference to FIG. 4. The contents duplicated with the adhesive film described above may be omitted, and like reference numerals designate like constituent elements. FIG. 4 is a cross-sectional view of an adhesive substrate according to the present invention.

Referring to FIG. 4, an adhesive substrate according to an exemplary embodiment of the present invention includes a liner 150, a photothermal conversion layer 130, an adhesive layer 120, and a substrate 600 to be processed, which are sequentially laminated. The adhesive layer 120 and the photothermal conversion layer 130 may be laminated on the substrate 600 to be processed. At the time of the processing process of the substrate 600 to be processed later, the photothermal conversion layer 130 adheres to a hard supporter.

The adhesive layer 120 and the photothermal conversion layer 130 of the adhesive substrate are the same as the adhesive layer and the photothermal conversion layer of the adhesive film described above. That is, the adhesive substrate according to the present invention may include the adhesive film and the substrate to be processed described above. However, the liner 150 may be disposed only on the photothermal conversion layer 130 in the adhesive substrate.

The substrate 600 to be processed may be a substrate for a flexible display.

For example, the substrate 600 to be processed can be use a plastic substrate, a metal thin film, or the like as the flexible substrate. However, the substrate 600 to be processed is not limited thereto, and as a material having a flexible characteristic, a material that can be used as a substrate for a flexible display is sufficient. Preferably, the substrate 600 to be processed may be a PI film.

The substrate 600 to be processed may be processed into a substrate on which an element layer is formed. The element layer may consist of a plurality of thin film layers and electrical elements, and more specifically, the element layer may include a thin film transistor including a gate electrode, a semiconductor layer, a source electrode, and a drain electrode. For example, the thin film transistor and an organic layer are formed on the substrate 600 to be processed and an encapsulation layer is formed on the thin film transistor and the organic layer to manufacture the processed substrate.

The flexible display may be any one selected from the group consisting of an organic light emitting diode display, a liquid crystal display, and an electrophoretic display. However, the present invention is not limited thereto, and the flexible display may include all flexible displays using a flexible substrate.

The liner 150 serves to support and protect the photothermal conversion layer 130. The liner 150 is removed when the photothermal conversion layer 130 is attached to the supporter to process the substrate 600 to be processed. The liner 150 may be silicone-coated polyethylene terephthalate (PET), but is not limited thereto, and a material capable of supporting and protecting the photothermal conversion layer 130 is sufficient.

The film type photothermal conversion layer 130 is laminated on the film type adhesive layer 120 formed on the substrate 600 to be processed by a roll-to-roll method, and thereafter, the liner 150 may be laminated on the photothermal conversion layer 130 by the roll-to-roll method in the same manner to form the adhesive substrate.

However, the manufacturing process of the adhesive substrate of the present invention is not limited thereto, and any method in which the adhesive layer 120 and the film type photothermal conversion layer 130 are laminated on the substrate 600 to be processed to be in contact with each other is sufficient.

The adhesive substrate of the present invention uses the film type photothermal conversion layer 130, thereby significantly reducing the required time of the process as compared with a case of using the liquid material and reducing costs and the like required for the applying process, the curing process, the vacuum process, and the like. Furthermore, since the adhesive substrate of the present invention includes the substrate 600 to be processed, a step of adhering the adhesive film to the substrate to be processed in the processing process of the substrate is omitted, thereby simplifying the process and reducing the time and the cost.

Figure 5A:
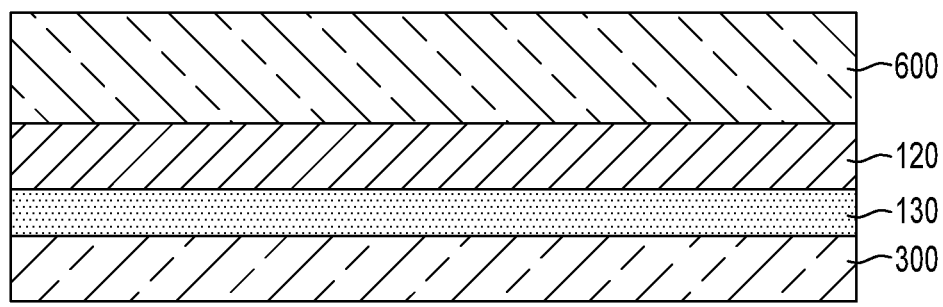
FIGS. 5A to 5C are diagrams illustrating a processing process of a substrate using the adhesive substrate according to the present invention.
Figure 5B:
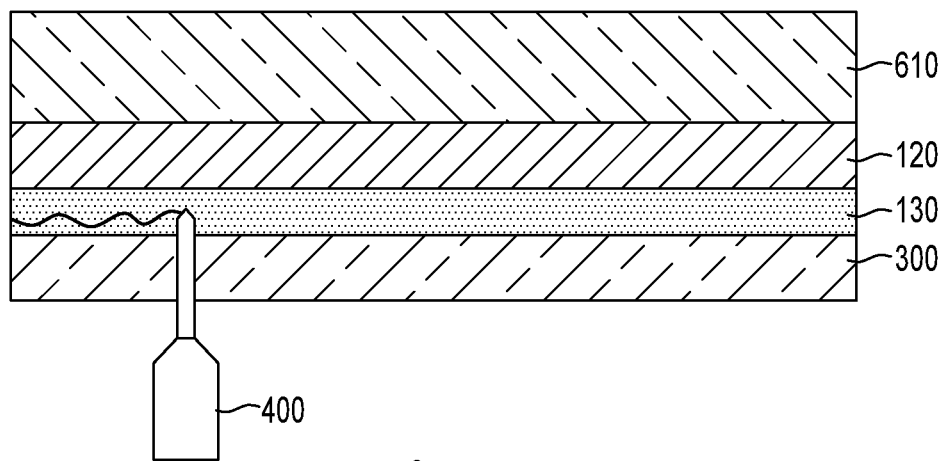
Figure 5C:
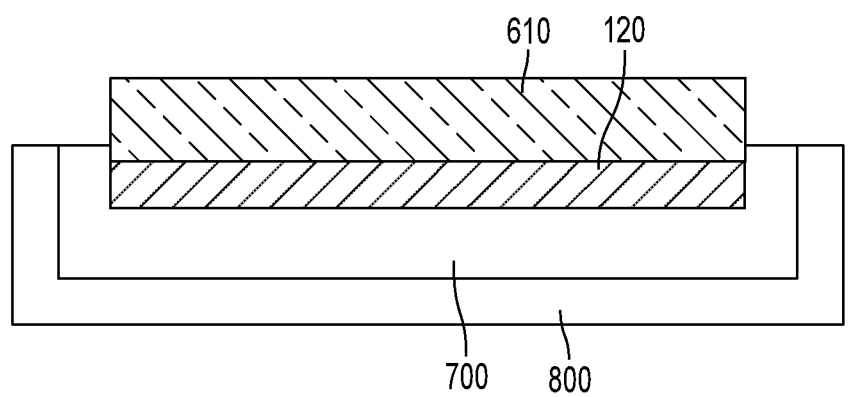

FIGS. 5A to 5C are diagrams illustrating a processing process of the substrate using the adhesive substrate according to the present invention.

Referring to FIG. 5A, in the adhesive substrate according to the present invention, the liner is removed and the photothermal conversion layer 130 is attached to the support 300. In this case, the process is preferably performed at about 40° C. to about 80° C. so that the adhesion between the photothermal conversion layer 130 and the supporter 300 is increased.

The supporter 300 is a material capable of transmitting the radiation energy such as the laser used in the present invention and the material is required for maintaining the substrate 600 to be processed in a flat state and preventing the substrate 600 to be processed from being broken during processing and conveying. The supporter 300 is preferably hard and transmissive.

The transmissivity of the supporter 300 is not limited unless it prevents radiation energy from being transmitted into the photothermal conversion layer 130, in order to enable decomposition of the photothermal conversion layer 130. However, a transmittance may be, for example, about 50% or more.

In addition, in order to prevent the substrate to be processed from being distorted during processing, it is preferable that the supporter 300 has sufficiently high rigidity, and the bending strength of the supporter 300 is preferably $2 \times 10^{-3}$ (Pa·m$^3$) or greater and more preferably $3 \times 10^{-2}$ (Pa·m$^3$) or greater.

Further, it is preferable that the supporter 300 has sufficient heat resistance to prevent damage due to a thermal history that may occur in a process performed on the substrate to be processed, and the thermal deformation temperature of the supporter 300 is preferably 550° C. or higher and more preferably 700° C. or higher.

The supporter 300 may be, for example, glass. Further, in order to improve the adhesion strength to an adjacent layer such as the photothermal conversion layer 130, the supporter 300 may be surface-treated with a bonding agent or the like, if necessary.

Thereafter, the substrate 600 to be processed and the supporter 300 are fixed to each other with the adhesive film including the photothermal conversion layer 130 and the adhesive layer 120 interposed therebetween, and then the substrate 600 to be processed is processed. The substrate 600 to be processed is a substrate which is fixed and processed to the supporter 300 and then separated from the supporter 300.

The substrate 600 to be processed is a substrate for a flexible display and may be processed into a substrate having an element layer formed on the substrate 600 to be processed.

Referring to FIG. 5B, after a desired level of processing, separation of a supporter 300 and a processed substrate 610 is performed by irradiating the laser 400. The laser 400 is irradiated from the supporter 300 side.

The light absorber of the photothermal conversion layer 130 absorbs the radiation energy by the laser 400 to convert the radiation energy into thermal energy. The generated thermal energy rapidly increases the temperature of the photothermal conversion layer 130 and the temperature causes decomposition of the thermally decomposable resin in the photothermal conversion layer 130. The gas generated by thermal decomposition forms a void layer in the photothermal conversion layer 130 and the photothermal conversion layer 130 is divided into two parts to separate the supporter 300 and the processed substrate 610 from each other.

The thermally decomposable resin in the photothermal conversion layer 130 is decomposed by the irradiation of the laser 400 to form a crack inside the layer so as to separate the photothermal conversion layer itself. The gas generated by the decomposition of the resin is eventually introduced between the two layers to separate the two layers from each other. Accordingly, in order to promote the introduction of the gas, it is preferable to perform irradiation of the laser 400 into the photothermal conversion layer 130 from the edge portion of the photothermal conversion layer 130.

In order to use the laser 400 from the edge portion of the photothermal conversion layer 130, a method of applying the laser 400 while reciprocating linearly from the edge portion, or alternatively, a method of spirally irradiating the laser 400 from the edge portion to the center like a phonograph may also be used.

The laser 400 is generally a laser having a wavelength of about 300 to about 11,000 nm and preferably about 300 to about 2,000 nm, and as a specific example, the laser 400 includes a YAG laser emitting light at a wavelength of 1,064 nm, a second harmonic wave generation YAG laser at a wavelength of 532 nm, and a semiconductor laser having a wavelength of 780 to 1,300 nm.

Referring to FIG. 5C, after the supporter 300 is removed, the adhesive layer 120 on the processed substrate 610 is removed. A removal solution 700 may be used to remove the adhesive layer 120. Although not clearly illustrated in the drawing, after the photothermal conversion layer is divided on the adhesive layer 120, a part of the photothermal conversion layer may remain. The adhesive layer 120, in which the part of the photothermal conversion layer remains, may be immersed in the removal solution 700 to remove the adhesive layer 120.

Preferably, the adhesive layer 120 may be removed by immersing the adhesive layer 120 in the removal solution 700 contained in a container 800 for about 10 seconds to 60 seconds. Such a removal solution 700 may include trans-1, 2-dichloroethylene and hydrofluoroether.

Particularly, when the processed substrate 610 has a large size or a large area, or when the processed substrate 610 is made of a thin and fragile material, it is advantageous to use the removal solution 700 at the time of removing the adhesive layer 120. There is no need for additional external physical force to use the removal solution 700, and the adhesive layer 120 may be removed without a residue in a short time.

Meanwhile, although not illustrated in the drawing, in order to remove the adhesive layer 120, a removal tape having stronger adhesion to the adhesive layer 120 than the adhesion between the processed substrate 610 and the adhesive layer 120 may be used. When the size or area of the adhesive layer 120 or the processed substrate 610 is small, the adhesive layer 120 may be easily removed by using such a removal tape.

The method of processing the substrate according to the present invention is eco-friendly and may prevent additional damage to the substrate. Further, the process is simplified, thereby reducing the processing cost and time.

Hereinafter, the present invention will be described in more detail through Experimental Examples, but the following Experimental Examples are just to verify the present invention and the present invention is not limited thereto. That is, Examples of the present invention may be modified into various forms and the scope of the present invention should not be construed to be limited by Experimental Examples to be described below.

Example 1

6 wt % of carbon black having a particle size of 240 nm (Cancarb Corporation), 4 wt % of titania (Huntsman) having a particle size of 240 nm and 1 wt % of a dispersant (BYK Chemie Japan Co., Ltd.) were added to 75 wt % of methylethyl ketone (MEK, Samchun Chemical Co., Ltd.) and dispersed for 30 minutes by using an ultrasonic disperser to prepare a solution in which a light absorber was dispersed. 7 wt % of a high molecular weight acrylic polymer elastomer other than PSA having a weight average molecular weight of 1,000,000 g/mol and a COOH/OH functional group of 10 mgKOH/g or more and 7 wt % of a low molecular weight acrylic polymer elastomer other than PSA having a weight average molecular weight of 500,000 g/mol and a COOH/OH functional group of 5 mgKOH/g or more were mixed with each other and stirred for 30 minutes by a stirrer to prepare a thermally decomposable resin. The thermally decomposable resin was added in a solution in which the light absorber was dispersed and then stirred again for 20 minutes. Thereafter, methyl ethyl ketone (MEK) was added so that the mixture had viscosity suitable for coating of 200 CPS to 5,000 CPS. The completed mixture was applied on release polyethylene terephthalate (PET) (SG-31) with a thickness of 5 μm by a coater having a comma roll head and then dried for 2 minutes under a temperature of 110° C. to 130° C. to form a film type photothermal conversion layer.

The photothermal conversion layer prepared by such a method included 24 wt % of carbon black, 16 wt % of titania, 4 wt % of a dispersant, 28 wt % of a high molecular weight acrylic polymer elastomer, and 28 wt % of a low molecular weight acrylic polymer elastomer based on the total weight of the photothermal conversion layer.

An adhesive layer (3M Company, ATT4025) formed on the previously prepared first liner and the photothermal conversion layer formed on the second liner were laminated through a roll-to-roll process to prepare a final adhesive film.

Thereafter, the second liner was first removed to bond the supporter to the photothermal conversion layer, and the first liner was removed to bond the substrate to be processed and the adhesive layer to form a laminate of a glass plate, an adhesive film and a wafer. It took about 3 minutes to laminate the adhesive film to the supporter and the substrate to be processed, and all bonding processes were performed on a hot plate at 70° C.

A circular glass plate (Corning) of 203 mm (diameter)× 0.7 mm was used as a transmissive supporter, and a circular silicon wafer of 203 mm (diameter)×750 μm (thickness) was used as the substrate to be processed.

Thereafter, the laminate of the glass plate, the adhesive film, and the wafer was placed on a grinding device, and the grinding was performed by contacting a grinding wheel rotating while water is supplied with the laminate. The grinding was performed to provide a wafer thickness of 50 μm.

After the grinding was completed, laser irradiation was performed using a YAG laser (wavelength: 1,064 nm) having a laser output of 15 W, a laser diameter and a scanning pitch of 100 μm, and a laser irradiation speed of 1.0 m/s. The laser was irradiated to the laminated and the entire surface of the laminate by linearly reciprocating in a tangential direction from the edge portion of the laminate. Thereafter, the glass plate was easily separated from the ground wafer, and a wafer having the adhesive layer was obtained thereon.

In order to peel the adhesive layer from the wafer, a pressure-sensitive removal tape (3M; SCOTCH™ #3305) was attached to the surface of the adhesive layer at a temperature of 40° C. and peeled in a 180° direction to obtain a silicon wafer having a thickness of 50 μm without wafer damage.

Examples 2 to 8

A laminated film including a film type photothermal conversion layer according to Examples 2 to 8 was prepared in the same manner as in Example 1 except for the content of each component. The contents of components of the photothermal conversion layer in each Example were illustrated in Table 1 below.

TABLE 1

|  | Example 2 | Example 3 | Example 4 | Example 5 | Example 6 | Example 7 | Example 8 |
|---|---|---|---|---|---|---|---|
| High molecular weight acrylic polymer elastomer | 25 wt % | 21.5 wt % | 21.5 wt % | 17.5 wt % | 16.4 wt % | 20.5 wt % | 24.6 wt % |
| Low molecular weight acrylic polymer elastomer | 25 wt % | 21.5 wt % | 21.5 wt % | 17.5 wt % | 32.8 wt % | 28.7 wt % | 24.6 wt % |
| Carbon black | 33 wt % | 49 wt % | 28 wt % | 32 wt % | 32.8 wt % | 32.8 wt % | 32.8 wt % |
| Titania | 16 wt % | 7 wt % | 28 wt % | 32 wt % | 16.4 wt % | 16.4 wt % | 16.4 wt % |
| Dispersant | 1 wt % | 1 wt % | 1 wt % | 1 wt % | 1.6 wt % | 1.6 wt % | 1.6 wt % |

Subsequently, the supporter and the photothermal conversion layer were bonded to the each other and the substrate to be processed and the adhesive layer were bonded to each other to form the laminate of the glass plate, the adhesive film, and the wafer. Thereafter, in the same manner as Example 1, the grinding of the wafer was performed, and the laser was irradiated to the laminate to separate the supporter. Thereafter, the adhesive layer was peeled using the pressure-sensitive removal tape. The process was performed in the same manner as Example 1.

In the laminate according to Examples 2 to 8, when the glass plate was easily separated from the ground wafer, the supporter can be easily separated and the wafer having the adhesive layer thereon may be obtained without damage. Further, in the case of peeling the adhesive layer with the removal tape, it was verified that there was no damage to the wafer.

Comparative Example 1

A liquid photothermal conversion material (3M LTHC ink) was coated on a supporter (Dow corning glass (8 inch)) by a spin coating method. After coating, the photothermal conversion material was thermally cured for 2 hrs at a temperature of 150° C. to 180° C. to prepare a supporter coated with the photothermal conversion material having a thickness of about 0.9 μm.

The adhesive material (3M; LC-5320) was coated on the substrate to be processed (Bare mirror wafer, 8 Inch, 750 um) by a spin coating method. The amount of adhesive material required for one coating was at least 2 g to at most 10 g. The spin coating is implemented by adjusting a rotation speed in two steps, and rotates at 500 RPM in the first step and rotates 1200 RPM in the second step. The adhesive layer is formed on the substrate to be processed through the spin coating and then the supporter coated with the photothermal conversion material and the substrate to be processed coated with the adhesive material were bonded to each other under a vacuum of $10^{-5}$ to $10^{-9}$ (Torr). Thereafter, the adhesive material was irradiated with UV at the intensity of 1200 mJ/cm$^2$ and photo-cured to prepare the substrate to be processed which was coated with the adhesive material.

It took about 125 minutes to prepare the laminate by forming the photothermal conversion material and the adhesive material between the supporter and the substrate to be processed.

Comparative Example 2

A test was performed in the same manner as Examples except that a laminate consisting of a silicon wafer, a pressure-sensitive removal tape, and a glass substrate was prepared by using a double-sided pressure-sensitive removal tape (SCOTCH™ #9415 high adherence/low adherence) instead of the bonding layer in a state where the adhesive having a lower adherence than that of the wafer contacted the wafer without using any photothermal conversion layer. The silicon wafer could not be peeled.

Experimental Example 1

Heat Resistance Test

The heat resistance of film samples in Example 1, Examples 6 to 8, and Comparative Example 1 was evaluated using a thermogravimetric analyzer (TGA). 10 mg of each sample was split, and the weight loss of the sample was measured at a specific temperature (200° C. and 250° C.) and a lapse of time (1 hr) under a nitrogen atmosphere. The result is illustrated in Table 2 below.

TABLE 2

| | | Example 1 | Example 6 | Example 7 | Example 8 | Comparative Example 1 |
|---|---|---|---|---|---|---|
| Wight loss | 200° C. | 0.6 wt % | 0.8 wt % | 0.6 wt % | 0.5 wt % | 0.7 wt % |
| | 250° C. | 2.0 wt % | 1.7 wt % | 1.4 wt % | 1.1 wt % | 2.4 wt % |

Referring to Table 2 above, similar weight loss was observed in Examples and Comparative Example 1 at 200° C., but the weight loss was significantly different at 250° C. Accordingly, it can be confirmed that Example 1 and Examples 6 to 8 have more excellent heat resistance than Comparative Example 1.

Figure 6:
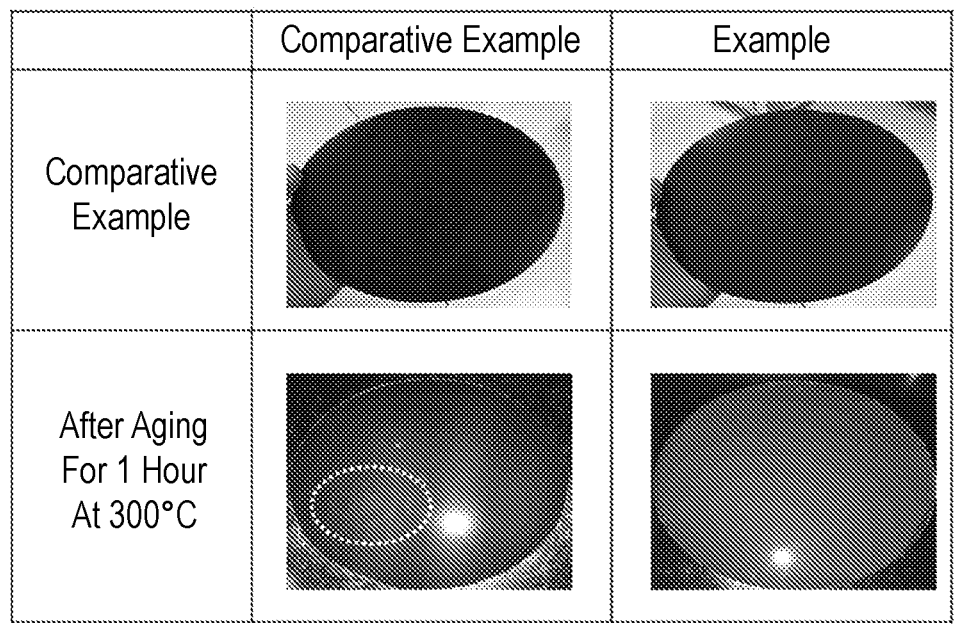
FIG. 6 is a diagram illustrating a heat-resistance test result.

In addition, the laminate prepared according to Example 1 and the laminate prepared according to Comparative Example 1 were aged at 300° C. in a nitrogen atmosphere for 1 hour, respectively. As a result, referring to FIG. 6, there was no damage to both the laminate prepared according to Comparative Example 1 and the laminate prepared according to Example 1 at room temperature after the bonding process, but after aging at 300° C. for 1 hour, it was visually confirmed that the damage occurred in the laminate prepared according to Comparative Example 1.

Therefore, it can be confirmed that the Examples using the film type adhesive film is excellent in heat resistance like the present invention.

Experimental Example 2

Light Blocking Property Test

In order to evaluate a light blocking property, film samples in Examples 1 to 5 and Comparative Example 1 were laminated between two slide glasses. The prepared laminate was placed in a sensor portion of a laser indicator (NOVA II from OPHIR Photonics Corporation) and then irradiated with a laser at a laser output of 20 W using a YAG laser (SS16-716, wavelength: 1,064 nm, laser diameter: 0.4 mm, frequency: 25 KHz, irradiation speed: 1100 mm/s, hatch: 0.05 mm).

As a result, the laminate prepared according to Comparative Example 1 had a light transmittance of 19% measured by light of 3.7 W, and the laminates prepared according to Examples 1 to 5 had a light transmittance of 1% measured by light of 0.2 W, respectively.

Therefore, it can be confirmed that Examples using the film type adhesive film are more excellent in light blocking effect than Comparative Example 1 like the present invention.

Experimental Example 3

Adhesion Test

After the photothermal conversion layers of the adhesive films according to Examples 2 to 5 were bonded to the glass plate, the adhesion between the glass plate and the photothermal conversion layer after bonding and after aging at 220° C. for 1 hour was measured, respectively.

In addition, after the adhesive layers of the adhesive films according to Examples 2 to 5 were bonded to the wafer, the adhesion between the wafer and the adhesive layer after bonding and after aging at 220° C. for 1 hour was measured, respectively.

The result is illustrated in Table 3 below.

TABLE 3

| | | After bonding | After 1 hr aging at 220° C. |
|---|---|---|---|
| Adhesion between adhesive film and wafer (gf/25 mm) | | 409.53 | 178.97 |
| Adhesion between adhesive film and glass plate (gf/25 mm) | Example 2 | 1646.54 | >2000.00* |
| | Example 3 | 217.72 | >2000.00* |
| | Example 4 | 420.87 | >2000.00* |
| | Example 5 | 148.89 | >2000.00* |

*2000 gf/25 mm refers to adhesion between a removal tape for peeling the adhesive film and the adhesive film. Since the adhesive film is soft, the adhesion can not be measured by directly pulling the adhesive film and the adhesion is measured while bonding and peeling another substrate on the upper portion of the adhesive film. At this time, since the adhesion between the adhesive film and the glass plate is too high, the adhesive film is not separated, and while another substrate (removal tape) bonded to the upper portion and the adhesive film are separated from each other, 2000 gf/25 mm is measured. As a result, it is expected that the adhesion between the adhesive film and the glass plate is actually larger than 2000 gf/25 mm.

Referring to Table 3, Example 2 in which the content of acrylic resin is high had the highest adhesion after bonding. However, it was confirmed that when the heat treatment was performed, the adhesion was high in all Examples, and the adhesive film and the glass plate were not separated from each other before the laser irradiation, and the adhesion between the glass plate and the adhesive film was excellent during the process.

Meanwhile, the initial adhesion between the adhesive layer and the wafer was 400 gf/25 mm or more, but decreased to about 180 gf/25 mm when constant heat was applied. Therefore, due to the adhesion decreased by heat, it is easy to peel the adhesive film and the wafer after the process, and the residue may not be left.

Experimental Example 4

Optimization of Contents of Carbon Black and Acrylic Resin

Laminated films according to Examples 9 to 27 were prepared in the same manner as in Example 1 except for the content of each component. In addition, in Examples 25 to 27, alumina (Denka) was used instead of titania. In Examples 9 to 27, all the film type photothermal conversion layers could be formed, and the laminated films containing the photothermal conversion layers could be prepared.

Next, the bonding performance, the de-bonding performance after laser irradiation, and the peeling performance for the glass plate of the photothermal conversion layer of the laminated film according to Examples 9 to 27 were tested.

The bonding performance test was performed when the prepared adhesive film was bonded onto the glass plate cut with a width of 1 inch using a roller at 70° C., PET was attached onto the adhesive film bonded with the glass plate, and then the adhesive film including the PET was peeled from the glass plate using a UTM, and the adhesion was measured (peeling speed: 300 mm/min, peeling angle: 180) and the bonding state was observed with naked eyes. The results were classified according to the following criteria.

◉: Bonded to the front surface of the glass plate well,

Δ: A void is observed on the entire surface of the glass plate,

X: Bonding is not partially or entirely performed well.

The de-bonding performance test after the laser irradiation was performed when the prepared adhesive film was bonded to the glass plate at 70° C., and then the glass plate bonded with the adhesive film was bonded onto the wafer at 40° C. again, and thereafter, the de-bonding degree was confirmed by de-bonding through the laser irradiation. The results were classified according to the following criteria.

◉: Easily removable without any external stimulus,

○: Weak force needs to be applied to separate the photothermal conversion layer and the glass plate, Δ: De-bonding is enabled by applying strong force and lifting (no processibility)

X: No de-bonding (no processibility)

The peeling performance test was performed when the glass plate was de-bonded after the laser irradiation, the adhesive layer left on the wafer was removed using a pressure-sensitive removal tape (3M; SCOTCH™ #3305) at 40° C., and then the residue was checked with naked eyes. The results were classified according to the following criteria.

◉: Removable without any residue,

○: A small amount of residue is found along the edge of the glass plate,

Δ: A small amount of residue is found outside the edge,

X: There are many parts which are not peeled as a whole.

The contents of components of the photothermal conversion layer and experimental results in each Example are illustrated in Table 4 below, and each value represents wt %.

TABLE 4

| | Acrylic resin | | | | | | | |
|---|---|---|---|---|---|---|---|---|
| | High molecular weight acrylic polymer elastomer | Low molecular weight acrylic polymer elastomer | Carbon black | Titania | Alumina | Bonding performance | Peeling performance | De-bonding performance |
| Example 9 | 17 | 17 | 66 | 0 | 0 | X | X | ◉ |
| Example 10 | 33.5 | 33.5 | 22 | 11 | 0 | ◉ | Δ | ○ |
| Example 11 | 27.5 | 27.5 | 36 | 9 | 0 | ◉ | ◉ | ○ |
| Example 12 | 21.5 | 21.5 | 50 | 7 | 0 | ◉ | ◉ | ○ |

TABLE 4-continued

| | Acrylic resin | | | | | | | |
| | High molecular weight acrylic polymer elastomer | Low molecular weight acrylic polymer elastomer | Carbon black | Titania | Alumina | Bonding performance | Peeling performance | De-bonding performance |
|---|---|---|---|---|---|---|---|---|
| Example 13 | 17 | 17 | 61 | 5 | 0 | Δ | X | ⊚ |
| Example 14 | 13 | 13 | 70 | 4 | 0 | X | X | ⊚ |
| Example 15 | 30 | 30 | 20 | 20 | 0 | ⊚ | ⊚ | ⊚ |
| Example 16 | 25 | 25 | 33 | 17 | 0 | ⊚ | ⊚ | ⊚ |
| Example 17 | 20 | 20 | 47 | 13 | 0 | ⊚ | Δ | ⊚ |
| Example 18 | 15.5 | 15.5 | 58 | 11 | 0 | Δ | Δ | ⊚ |
| Example 19 | 12.5 | 12.5 | 67 | 8 | 0 | X | X | ⊚ |
| Example 20 | 16.75 | 16.75 | 66.5 | 0 | 0 | ⊚ | X | ⊚ |
| Example 21 | 21.5 | 21.5 | 50 | 7 | 0 | ⊚ | ⊚ | ⊚ |
| Example 22 | 17 | 17 | 50 | 16 | 0 | ⊚ | X | ⊚ |
| Example 23 | 13.5 | 13.5 | 50 | 23 | 0 | X | Δ | ⊚ |
| Example 24 | 21.5 | 21.5 | 50 | 0 | 7 | ⊚ | ⊚ | ⊚ |
| Example 25 | 17 | 17 | 50 | 0 | 16 | ⊚ | Δ | ⊚ |
| Example 26 | 13.5 | 13.5 | 50 | 0 | 23 | Δ | X | ⊚ |
| Example 27 | 16.5 | 16.5 | 66.5 | 7 | 0 | X | Δ | ⊚ |

Referring to Table 4, in Examples 9 to 27, a film type photothermal conversion layer can be formed. In particular, it can be confirmed that when the content of the acrylic resin (a sum of the contents of the high molecular weight acrylic polymer elastomer and the low molecular weight acrylic polymer elastomer) is 40 wt % or more and the total content of the filler (a sum of the contents of carbon black, titania, and alumina) is 60 wt % or less, the bonding performance, the peeling performance, and the like are excellent.

Experimental Example 5

Optimization of Acrylic Resin

Laminated films including film type photothermal conversion layers according to Comparative Examples 3 and 4 and Example 28 were prepared in the same manner as in Example 1 except for the content of each component. The contents of the components of the photothermal conversion layers in Comparative Examples 3 and 4 and Example 28 are illustrated in Table 5 below.

TABLE 5

| | Comparative Example 3 | Comparative Example 4 | Example 28 |
|---|---|---|---|
| High molecular weight acrylic polymer elastomer | 49.2 wt % | 0 wt % | 24.6 wt % |
| Low molecular weight acrylic polymer elastomer | 0 wt % | 49.2 wt % | 24.6 wt % |
| Carbon black | 32.8 wt % | 32.8 wt % | 32.8 wt % |
| Titania | 16.4 wt % | 16.4 wt % | 16.4 wt % |
| Dispersant | 1.6 wt % | 1.6 wt % | 1.6 wt % |

Subsequently, the bonding performance and heat resistance of the glass plate of the photothermal conversion layer of the laminated film according to Comparative Examples 3 and 4 and Examples 28 were tested.

The bonding performance test was performed when the prepared adhesive film was bonded onto the glass plate cut with a width of 1 inch using a roller at 70° C. and then the bonding state was observed with naked eyes, and PET was attached onto the adhesive film bonded with the upper portion of the glass plate and then the adhesive film including the bonded PET was peeled from the glass plate using a UTM (peeling speed: 300 mm/min, peeling angle: 180), and the peeling strength was measured.

Figure 7:
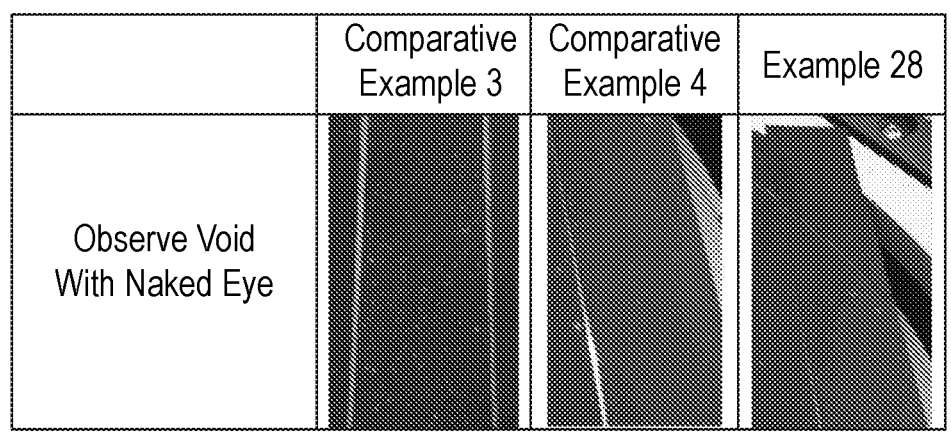
FIG. 7 is a diagram illustrating a bonding-performance test result.

The result of void observation through the naked eyes is illustrated in FIG. 7. Referring to FIG. 7, it can be confirmed that when only the high molecular weight polymer elastomer is used, it is poor in terms of void. Accordingly, it can be confirmed that the bonding performance of Example 28 is significantly better than that of Comparative Example 3.

Meanwhile, as the result of measuring the peel strength by UTM, Comparative Example 3 had the adhesion of 120 gf/25 mm, Comparative Example 4 had the adhesion of 1730 gf/25 mm, and Example 28 had the adhesion of 1600 gf/25 mm.

That is, when only the high molecular weight polymer elastomer is used, the adhesion of the adhesive film to the supporter is very low, and as a result, it is difficult to bond the adhesive film to the supporter and thus defects during the process may occur.

Accordingly, it can be confirmed that the peeling performance of Example 28 is significantly better than that of Comparative Example 3.

The heat resistance test was performed when the weight loss of the sample of prepared adhesive film was measured at a specific temperature (200° C. and 250° C.) and a lapse of time (1 hr) under a nitrogen atmosphere. The result is illustrated in Table 6 below.

TABLE 6

| | | Comparative Example 3 | Comparative Example 4 | Example 28 |
|---|---|---|---|---|
| Wight loss | 200° C. | 0.462 wt % | 1.644 wt % | 0.795 wt % |
| | 250° C. | 1.109 wt % | 2.449 wt % | 1.679 wt % |

Referring to Table 6, in Comparative Example 4 in which only the low molecular weight acrylic polymer elastomer is used, it can be confirmed that the weight loss is remarkably large and the heat resistance is poor. Accordingly, it can be confirmed that the heat resistance of Example 28 is significantly better than that of Comparative Example 4.

Therefore, it can be confirmed that the bonding performance, peeling performance, and heat resistance are entirely excellent when using an adhesive film including two kinds of acrylic resins having different weight average molecular weights like the present invention.

Example 29

In the same manner as Example 1, a film type photothermal conversion layer including 44 wt % of acrylic polymer elastomer (22 wt % of high molecular weight acrylic polymer elastomer and 22 wt % of low molecular weight acrylic polymer elastomer), 44 wt % of carbon black, 10.5 wt % of titania and 1.5 wt % of a dispersant was prepared.

A photothermal conversion layer formed on a second liner was laminated on an adhesive layer (3M Company, ATT 4025) formed on a previously prepared first liner through a roll-to-roll process to prepare an adhesive film, and the first liner was removed, a polyimide film was laminated on the adhesive layer to prepare a final adhesive substrate.

Experimental Example 6

Chemical Resistance Test

The chemical resistance of the adhesive substrate according to Example 29 was tested. The adhesive substrate was immersed in a chemical material under test conditions shown in Table 7 below, a change in weight after immersion was measured, and the damage on the surface was visually inspected. The result is illustrated in Table 7 below.

TABLE 7

|  | KOH | Amine | $H_2O_2$ | TMAH | $H_2SO_4$ | Acetone | IPA | NMP |
|---|---|---|---|---|---|---|---|---|
| Concentration (%) | 30 | 30 | 30 | 2.5 | 30 | 100 | 100 | 100 |
| Temperature (° C.) | 25 | 25 | 50 | 25 | 25 | 25 | 60 | 90 |
| Time (min) | 10 | 30 | 10 | 10 | 10 | 60 | 25 | 60 |
| Initial weight (mg) | 19 | 19 | 21 | 20 | 19 | 17 | 19 | 23 |
| Weight (mg) after immersion | 19 | 19 | 21 | 20 | 19 | 12 | 19 | 23 |
| Weight change (mg) | 0 | 0 | 0 | 0 | 0 | 5 | 0 | 0 |
| Weight loss (%) | 0 | 0 | 0 | 0 | 0 | 29.41 | 0 | 0 |
| No heat aging | No problem | No problem | No problem | No problem | No problem | Damage to adhesive layer and photothermal conversion layer | Damage to adhesive layer | Damage to adhesive layer and photothermal conversion layer |
| Heat aging for 1 hr at 200° C. | No problem | No problem | No problem | No problem | No problem | No problem | No problem | No problem |

In general, when an element layer is formed on a substrate to be processed, a chemical material is used in a silicon etching process or the like. Accordingly, in order to stably perform the processing process of the substrate, the adhesive film needs to have chemical resistance.

Referring to Table 7, it can be confirmed that the adhesive substrate according to the present invention has chemical resistance in most chemical materials. Particularly, in the case of the aging process, it can be confirmed that there is no problem in all of the tested chemical substances, and the adhesive substrate has excellent chemical resistance.

Experimental Example 7

Peeling Performance Test of Removal Solution

An adhesive substrate according to Example 29 was irradiated with a laser to separate the support, and then the peeling performance of the adhesive layer was tested. The peeling performance test was performed when the adhesive layer was removed using a removal solution (3M; Novec 73DE), and then the residue was visually confirmed. The results were classified according to the following criteria.

◉: Removable without any residue,
○: A small amount of residue was found along the edge of the glass plate,
Δ: A small amount of residue is found outside the edge,
X: There are many parts which are not peeled as a whole.

The results of the peeling performance test are illustrated in Table 8 below.

TABLE 8

| Whether sample is treated | Removal solution (3M 73DE) | |
|---|---|---|
|  | No aging | Aging for 1 hr at 220° C. |
| Peeling performance | ◉ | ◉ |

Referring to Table 8 above, the removal performance of the adhesive layer by the removal solution is very excellent. When the removal solution was used, the adhesive layer was completely removed regardless of the heat treatment of the sample. The removal of the adhesive layer using such a removal solution is particularly suitable for a flexible display having a large screen because external physical force is not required.

As described above, the exemplary embodiments of the present invention are described, but are just exemplified, and it should be understood by those skilled in the art that various modifications and equivalents may be made. Therefore, it should be construed that the scope of the present invention includes not only the following claims but also equivalents thereof.

EXPLANATION OF REFERENCE NUMERALS AND SYMBOLS

110: First liner; 120: Adhesive layer; 130: Photothermal conversion layer; 140: Second liner; 150: Liner; 200: Substrate to be processed; 210: Processed substrate; 300: Supporter; 400: Laser; 500: Removal tape; 600: Substrate to be processed; 610: Processed substrate; 700: Removal solution; 800: Container

What is claimed:
1. An adhesive film comprising:
a photothermal conversion layer including a light absorber and a thermally decomposable resin having a —COOH or —OH functional group;
an adhesive layer,
a first removable liner; and
a second removable liner;

wherein the thermally decomposable resin includes a first and a second acrylic resin having different weight average molecular weights; and wherein the first removable liner, the adhesive layer, the photothermal conversion layer, and the second removable liner are sequentially laminated.

2. The adhesive film of claim 1, wherein the light absorber is carbon black.

3. The adhesive film of claim 1, wherein the first acrylic resin is a high molecular weight acrylic resin and the second acrylic resin is a low molecular weight acrylic resin, and the high molecular weight acrylic resin has a larger molecular weight than the low molecular weight acrylic resin, the weight average molecular weight of the high molecular weight acrylic resin is 400,000 g/mol to 15,000,000 g/mol, and the weight average molecular weight of the low molecular weight acrylic resin is 50,000 g/mol to 600,000 g/mol.

4. The adhesive film of claim 3, wherein a weight ratio of the high molecular weight acrylic resin to the low molecular weight acrylic resin is 1:4 to 4:1.

5. The adhesive film of claim 1, wherein the first and second acrylic resins two kinds of acrylic resins include monomers selected from the group consisting of methyl methacrylate (MMA), hydroxylethyl methacrylate (HEMA), ethyl acrylate (EA), butyl acrylate (BA), acrylonitrile (AN), and combinations thereof.

6. The adhesive film of claim 1, wherein an acid value of the —COOH or —OH functional group is 1 mgKOH/g or more.

7. The adhesive film of claim 1, wherein the photothermal conversion layer further includes an inorganic filler.

8. The adhesive film of claim 7, wherein the inorganic filler is selected from the group consisting of $SiO_2$, $Al_2O_3$, $TiO_2$ and combinations thereof.

9. The adhesive film of claim 1, wherein the photothermal conversion layer further includes a dispersant.

10. The adhesive film of claim 1, wherein the photothermal conversion layer has a thickness of 1 μm to 15 μm.

11. A method for processing a substrate, comprising:
providing the adhesive film according to claim 1;
removing the first removable liner and then attaching the adhesive layer to the substrate;
removing the second removable liner and then attaching the photothermal conversion layer of the adhesive film to a supporter;
forming a processed substrate by processing the substrate;
dividing the photothermal conversion layer by irradiating a laser to the photothermal conversion layer from the supporter side and separating the supporter from the processed substrate; and
removing the adhesive layer from the processed substrate by using a removal tape or a removal solution.

12. The method for processing a substrate of claim 11, wherein the processing of the substrate includes grinding an opposite surface of the substrate to which the adhesive is not adhered.

13. The method for processing a substrate of claim 11, wherein the removal solution includes trans-1,2-dichloroethylene and hydrofluoroether.

14. A method for forming the adhesive film according to claim 1, the method comprising:
providing the adhesive layer formed on the first liner;
providing the photothermal conversion layer formed on the second liner;
laminating the adhesive layer formed on the first liner to the photothermal conversion layer formed on the second liner.

* * * * *

UNITED STATES PATENT AND TRADEMARK OFFICE
CERTIFICATE OF CORRECTION

PATENT NO. : 11,434,393 B2
APPLICATION NO. : 16/468355
DATED : September 6, 2022
INVENTOR(S) : Yongsuk Yang Page 1 of 1

It is certified that error appears in the above-identified patent and that said Letters Patent is hereby corrected as shown below:

In the Claims

Column 27
Line 23, In Claim 5, after "acrylic resins", delete "two kinds of acrylic resins"

Signed and Sealed this
Twenty-first Day of February, 2023

Katherine Kelly Vidal
*Director of the United States Patent and Trademark Office*